United States Patent
Machida (10) Patent No.: US 6,730,898 B2
(45) Date of Patent: May 4, 2004

(54) PHOTOELECTRIC CONVERTER (75) Inventor: Satoshi Machida, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 10/119,416

(22) Filed: Apr. 8, 2002

(65) Prior Publication Data

US 2002/0166949 A1 Nov. 14, 2002

(51) Int. Cl.[7] .............................................. H01L 27/00
(52) U.S. Cl. ................................... 250/208.1; 348/310
(58) Field of Search .......................... 250/208.1, 214 R, 250/214 LA, 214 SW, 214, 214.1, 214 A, 214 AG, 214 DL, 214 LS; 348/301, 308, 310; 330/59, 308; 356/221, 222, 226; 327/514

(56) References Cited

U.S. PATENT DOCUMENTS

| | | | | |
|---|---|---|---|---|
| 5,233,180 A | * | 8/1993 | Tsuruta et al. | 250/208.1 |
| 5,900,623 A | * | 5/1999 | Tsang et al. | 250/208.1 |
| 6,054,704 A | * | 4/2000 | Pritchard et al. | 250/208.1 |
| 6,252,462 B1 | * | 6/2001 | Hoffman | 330/308 |
| 6,369,853 B1 | * | 4/2002 | Merrill et al. | 348/302 |
| 6,512,544 B1 | * | 1/2003 | Merrill et al. | 348/302 |

* cited by examiner

*Primary Examiner*—David Porta
*Assistant Examiner*—Patrick J. Lee
(74) *Attorney, Agent, or Firm*—Adams & Wilks (57) ABSTRACT

To provide a photoelectric converter in which random noise is reduced. In a photoelectric converter, an output terminal of a photoelectric converter means is connected to input terminals of a reset means and an amplifying means, a charge transfer means is connected to an output terminal of the amplifying means, another terminal of the charge transfer means is connected to a capacitor and a gate of a source follower amplifier, a source of the source follower amplifier is connected to a channel select means, another terminal of the channel select means is connected to a common signal line, and the common signal line is connected to a current source.

9 Claims, 9 Drawing Sheets

SAMPLING POINT

PHOTOELECTRIC CONVERTER

BACKGROUND OF THE INVENTION

1. Field of the Invention

The present invention relates to a photoelectric converter that receives a light reflected from an original to which the light is irradiated, and converts the light into an electric signal, and more specifically to a linear image sensor suitable for an image reading device such as a facsimile or an image scanner.

2. Description of the Related Art

Figure 4:
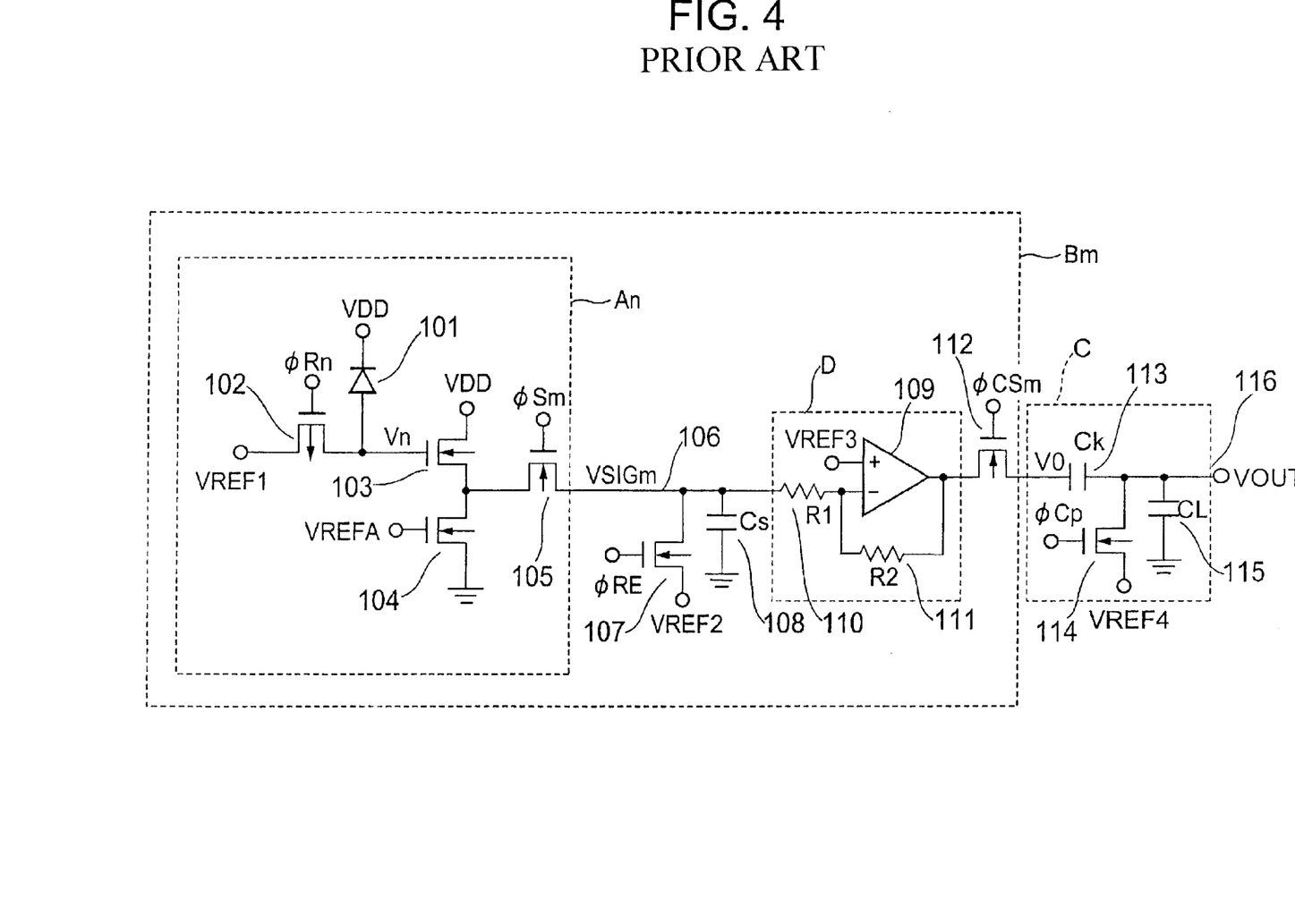
FIG. 4 is a circuit diagram of an image sensor IC used in a conventional image reading device.
Figure 5:
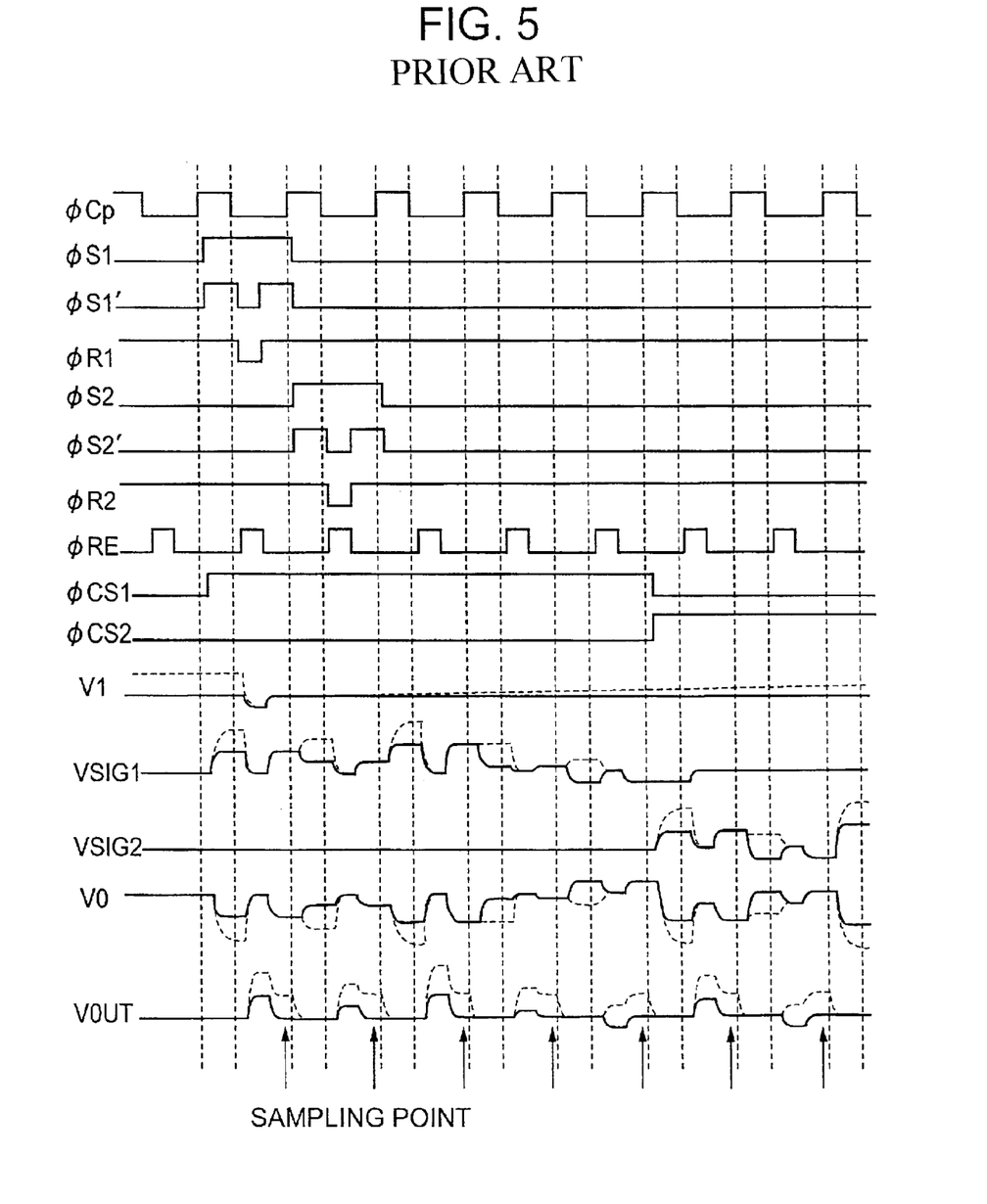
FIG. 5 is a timing chart of an image sensor IC used in a conventional image reading device.

A circuit diagram of an image sensor IC used in a conventional image reading device is shown in FIG. 4, and a timing chart thereof is shown in FIG. 5. The image sensor is disclosed in Japanese Patent Application Laid-open No. Hei 10-051164.

An n-type region of a photo diode 101 is connected to a positive supply voltage terminal VDD, and a p-type region is connected to a drain of a reset switch 102 and a gate of a source follower amplifier 103. A source of the reset switch 102 is given a reference voltage VREF1. A source that is an output terminal of the source follower amplifier 103 is connected to a read switch 105 and a constant current source 104. The gate of the constant current source 104 is given a constant voltage of a reference voltage VREFA. The number of elements disposed inside of a frame of a photoelectric conversion block An shown in FIG. 4 is identical with the number of pixels, and the read switches 105 of the respective blocks are connected to a common signal line 106. Note that the photoelectric conversion block An is indicative of a photoelectric conversion block of an n-th bit.

The common signal line 106 is inputted to an inverse terminal of an operational amplifier 109 through a resistor 110, and an output terminal of the operational amplifier 109 is connected to an output terminal 116 through a chip select switch 112 and a capacitor 113. The common signal line 106 is connected to a signal line reset switch 107, and a source of the signal line reset switch 107 is given a reference voltage VREF2. A resistor 111 is connected between the output terminal and the inverse terminal of the operational amplifier 109, and a non-inverse terminal of the operational amplifier 109 is fixed to a constant voltage VREF3. An inverse amplifier D is composed of the operational amplifier 109, the resistor 110 and the resistor 111.

An output terminal 116 of the image sensor is connected to a drain of the MOS transistor 114, and a source of the MOS transistor 114 is given a reference voltage VREF4. Also, the output terminal 116 of the image sensor is also connected to a capacitor 115 such as a parasitic capacitor. A clamp circuit C is composed of the capacitor 113, the capacitor 115 and the MOS transistor 114.

However, in the image sensor of the above type, the photo diode is reset after an optical signal voltage is read subsequent to the completion of photocharge storage, and thereafter the reference voltage is read, and a difference between the optical signal voltage and the reference voltage is taken. This leads to such a problem that reset noises put on the reference voltage and the optical signal voltage are different from each other. That is, because the reset noises of the different timings are compared with each other, there arises a problem in that the random noises are large.

SUMMARY OF THE INVENTION

In order to solve the above-mentioned problems inherent in the prior art, according to the present invention, there is provided a photoelectric converter in which: an output terminal of a photoelectric converter means is connected to input terminals of a reset means and an amplifying means; a charge transfer means is connected to an output terminal of the amplifying means; another terminal of the charge transfer means is connected to a capacitor and a gate of a source follower amplifier; a source of the source follower amplifier is connected to a channel select means; another terminal of the channel select means is connected to a common signal line; and the common signal line is connected to a current source, and the photoelectric converter is characterized in that: the channel select means is closed to read a reference voltage in the common signal line; the charge transfer means is closed to read signal charges in the capacitor; the charge transfer means is opened after the channel select means is opened; and the channel select means is closed to read a signal voltage in the common signal line; the reset means is closed to initialize the photoelectric conversion means; the charge transfer means is closed to read reference charges in the capacitor after the reset means is opened; and the charge transfer means is opens after the channel select means is opened.

Alternatively, the photoelectric converter according to the present invention is characterized in that: the channel select means is closed to read a reference voltage in the common signal line; the charge transfer means is closed to read signal charges in the capacitor; the charge transfer means is closed to read signal charges in the capacitor; the charge transfer means is opened to read a signal voltage in the common signal line; the reset means is closed to initialize the photoelectric conversion means; the charge transfer means is closed to read reference charges in the capacitor after the reset means is opened; and the channel select means is opened after the charge transfer means is opened.

Also, there is provided a photoelectric converter, in which: an output terminal of a photoelectric converter means is connected to input terminals of a reset means and a first amplifying means; a first charge transfer means is connected to an output terminal of the first amplifying means; another terminal of the first charge transfer means is connected to input terminals of a first capacitor and a second amplifying means; a second charge transfer means is connected to an output terminal of the second amplifying means; another terminal of the second charge transfer means is connected to input terminals of a second capacitor and a third amplifying means; a third charge transfer means is connected to an output terminal of the third amplifying means; another terminal of the third charge transfer means is connected to a third capacitor and a gate of a source follower amplifier; a source of the source follower amplifier is connected to a channel select means; another terminal of the channel select means is connected to a common signal line; and the common signal line is connected to a current source, characterized in that a following series of operations is repeated, in which: the second charge transfer means operates; subsequently, the first charge transfer means and the third charge transfer means operate; subsequently, the reset means and the second charge transfer means operate; subsequently, the first charge transfer means operates; subsequently, the channel select means operates; subsequently, the third charge transfer means operates; and subsequently, the channel select means operates.

According to this reading manner, since the reference voltage and the signal voltage containing the same off-noise of the reset switch are read in order, if a voltage difference is taken by using the correlated double sampling circuit or the like, a photoelectric converter small in the fixed pattern noise and the random noise can be obtained.

BRIEF DESCRIPTION OF THE DRAWINGS

These and other objects and advantages of this invention will become more fully apparent from the following detailed description taken with the accompanying drawings in which.

DETAILED DESCRIPTION OF THE PREFERRED EMBODIMENTS

Now, a description will be given in detail of preferred embodiments of the present invention referring to the accompanying drawings.

Figure 1:
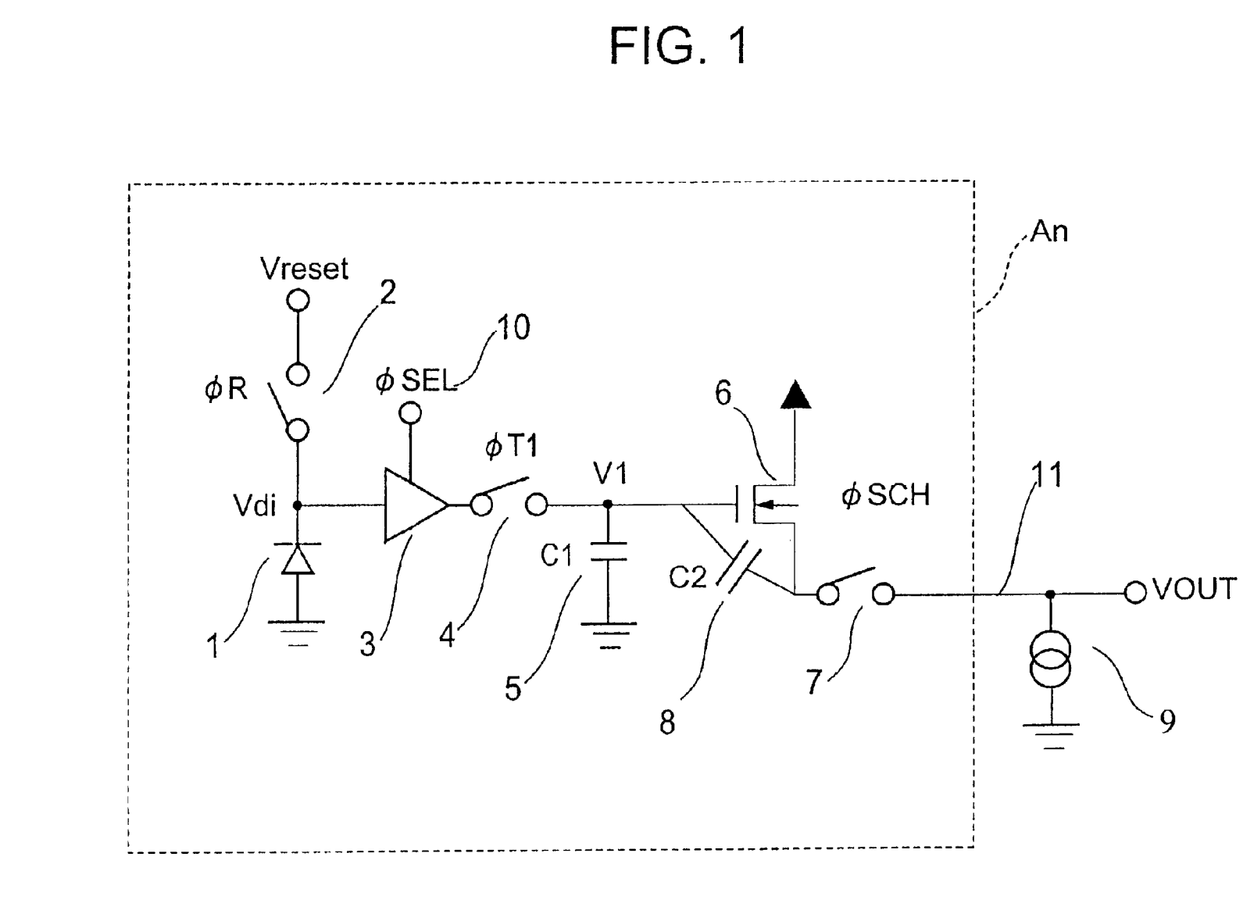
FIG. 1 is a circuit diagram showing a photoelectric converter in accordance with the present invention.

FIG. 1 is a circuit diagram showing a photoelectric converter in accordance with the present invention.

Figure 9:
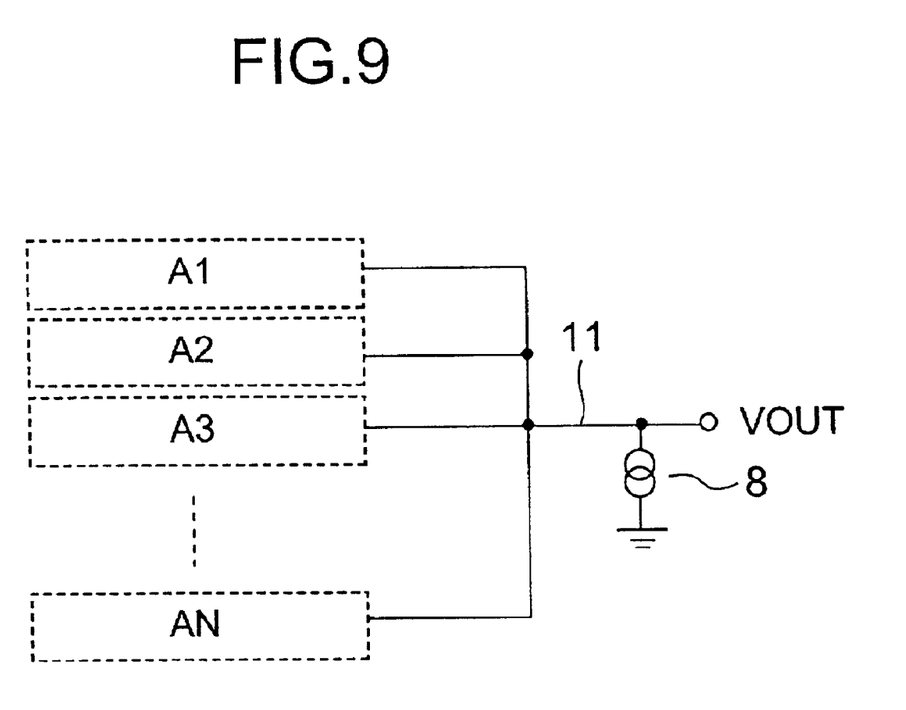
FIG. 9 is a circuit diagram showing a photoelectric converter in accordance with the present invention.

The number of elements disposed inside of a frame of a photoelectric conversion block An shown in FIG. 1 is identical with the number of pixels, and channel select switches 7 of the respective blocks are connected to a common signal line 11. Note that the photoelectric conversion block An is indicative of a photoelectric conversion block of an n-th bit. FIG. 9 shows an entire structure of the photoelectric converter.

The circuit shown in FIG. 1 is composed of a photodiode 1 that functions as a photoelectric conversion means, a transfer switch 4 that functions as a charge transfer means, a reset switch 2 that functions as a reset means, an amplifying means 3, a capacitor 5, a MOS transistor 6 that forms a MOS source follower, the channel select switch 7 that functions as a channel select means, the common signal line 11 and a current source 8. The amplifying means 3 is formed by a MOS source follower, a voltage follower amplifier and so forth. An amplification enable terminal 10 that selects any one of operation states maybe disposed in the amplifying means 3. Also, a parasitic capacitor 9 exists between the gate and the source of the MOS transistor 6.

Figure 2:
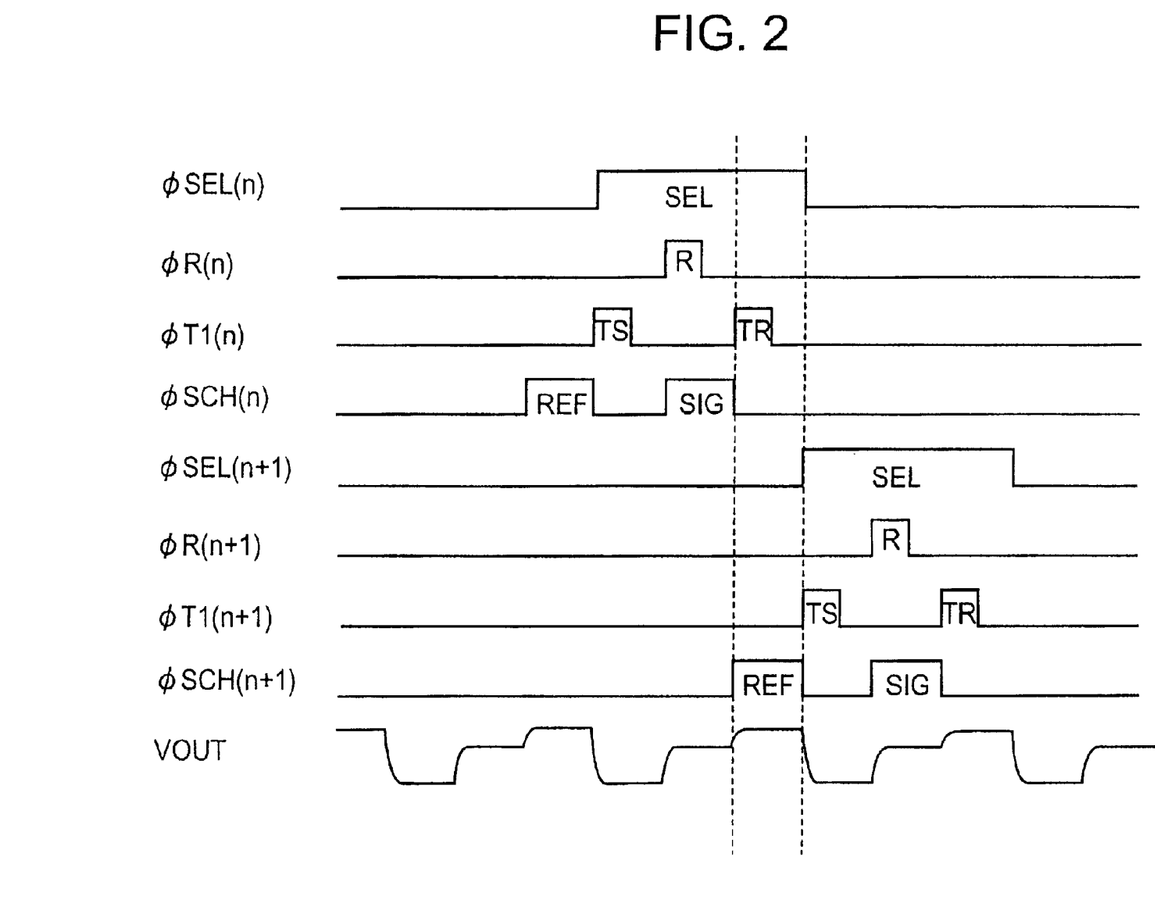
FIG. 2 is a timing chart of a photoelectric converter in accordance with a first embodiment of the present invention.

FIG. 2 is a timing chart of a photoelectric converter in accordance with a first embodiment of the present invention. Hereinafter, the operation and structure of the photoelectric converter in accordance with this embodiment will be described referring to the timing chart of FIG. 2. First, the operation of the photoelectric conversion block of the n-th bit will be described.

Upon turning on the reset switch 2 by ØR(n), an output terminal Vdi of the photodiode 1 is fixed to a reference voltage Vreset, and upon turning off the reset switch 2, a voltage of Vdi becomes a value resulting from adding an off-noise to Vreset. The off-noise becomes a random noise since the potential fluctuates whenever resetting is made. Therefore, in order to prevent the random noise, a difference between the output voltage of the amplifier 3 after resetting and the output voltage of the amplifier 3 after the photodiode stores the photocharges therein subsequent to resetting may be taken.

To satisfy the above condition, as shown in FIG. 2, after the reset switch 2 is turned off, the transfer switch 4 is turned on due to φT1(n), the reference charge is read in the capacitor 5 in a period of TR, and the reference charge is saved in the capacitor 5 for one period. During this period, the photocharge is stored in the photodiode 1, and the potential of Vdi varies in accordance with the amount of photocharges. When the channel select switch 7 is closed due to φSCH(n) in a succeeding cycle, the reference voltage corresponding to the reference charge is read in the common signal line 11 in a period of REF. Subsequently, φT1(n) is turned on, and a signal charge corresponding to the charges stored in the photodiode is read in the capacitor 5 in a period of Ts. In this situation, φT1(n) is turned off after φSCH(n) is turned off for a reason that will be described below.

Subsequently, when ØSCH(n) is again turned on, the signal voltage corresponding to the signal charges is read in the common signal line 11 in a period of SIG. The fixed pattern noise and the random noise caused by the reset switch 2 can be removed with a difference of the output voltages VOUT of the common signal line 11 between the period of REF and the period of SIG. On the other hand, after ØT1(n) is turned off, ØR(n) is turned on, and the photodiode for the next time is reset. Then, ØT1(n) is turned on, and the reference charge is read in the capacitor 5 in the period of TR. In this situation, ØT1(n) is turned off after ØSCH(n) is turned off for a reason that will be described below.

In the above reading manner, it is necessary to satisfy the following conditions. Because the parasitic capacitor 9 exists as shown in FIG. 1, the potential of the source of the MOS transistor 6 when the reference charges are transferred to the capacitor 5 must be identical with that when the signal charges are transferred to the capacitor 5. Since the reference charges and the signal charges are stored in C1 and C2, if the potentials of the source of the MOS transistor 6 are different from each other when the reference charges and the signal charges are transferred to the capacitor 5, even if the potential of V1 is identical, the amount of charges stored is different. This difference causes a voltage difference when the reference voltage and the signal voltage are read in the common signal line. The potential of the source of the MOS transistor 6 largely changes between the on-state and the off-state of the channel select switch 7. Therefore, in the example of FIG. 2, the channel select switch 7 is in the off-state in the periods of TS and TR. In particular, when ØT1(n) is turned off where the transfer of the charges is completed, it is necessary to turn off the ØSCH(n)

Figure 3:
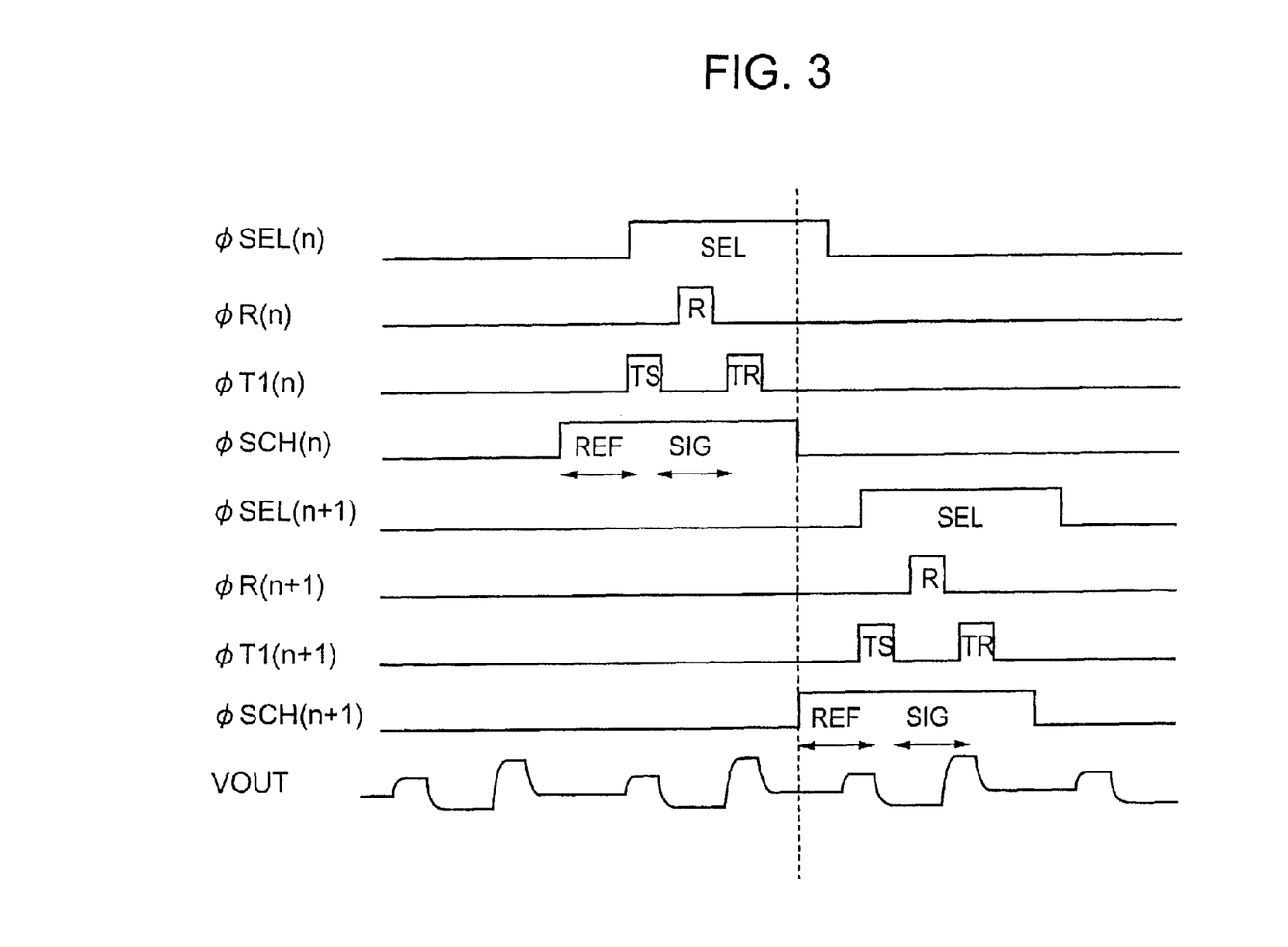
FIG. 3 is a timing chart of a photoelectric converter in accordance with a second embodiment of the present invention.

Contrary to FIG. 2, FIG. 3 shows a state where the channel select switch 7 is in the on-state in the periods of TS and TR. In this method, even after the read of the signal voltage in the period of SIG is completed, it is necessary to keep the on-state of ØSCH(N) until ØT1(n) is turned off.

In both of FIGS. 2 and 3, after the period of SIG, ØSCH(n) is turned off, the channel select switch 7 of the subsequent bit is opened by ØSCH(n+1), and the reference voltage of the subsequent bit starts to be read.

A difference between the reference voltage and the signal voltage is taken by using the correlated double sampling circuit. This can be achieved by, for example, the circuit of the block C in FIG. 4 of the conventional example.

Figure 6:
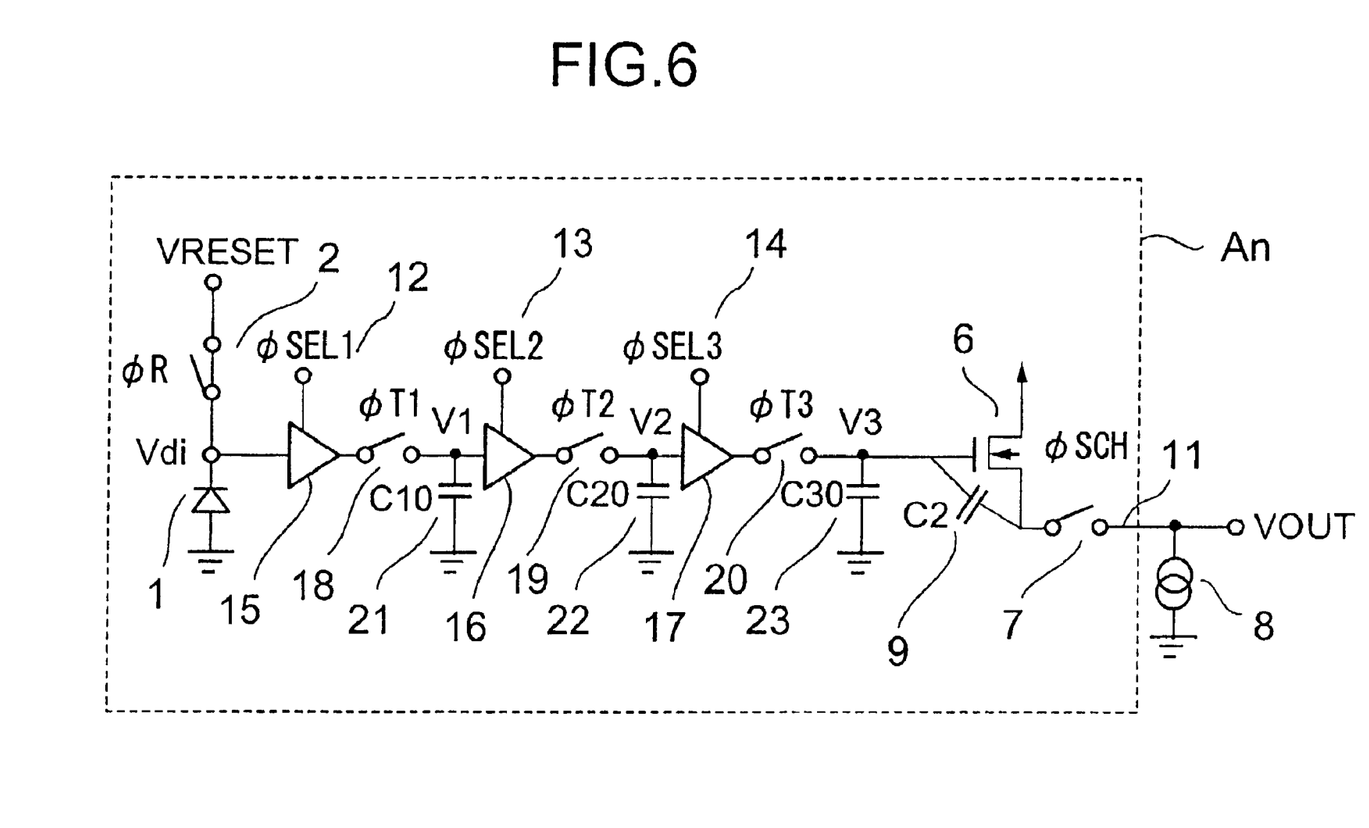
FIG. 6 is a circuit diagram showing a photoelectric converter in accordance with a third embodiment of the present invention.

FIG. 6 is a circuit diagram showing a photoelectric converter in accordance with a third embodiment of the present invention.

The number of elements disposed inside of a frame of a photoelectric conversion block An shown in FIG. 6 is identical with the number of pixels, and channel select switches 7 of the respective blocks are connected to a common signal line 11. Note that the photoelectric conversion block An indicates a photoelectric conversion block of an n-th bit. FIG. 9 shows an entire structure of the photoelectric converter.

The circuit shown in FIG. 6 is composed of a photodiode 1 that functions as a photoelectric converter means, transfer switches 18, 19 and 20 that function as charge transfer means, a reset switch 2 that functions as a reset means, amplifying means 15, 16 and 17, capacitors 21, 22 and 23, a MOS transistor 6 that forms a MOS source follower, the channel select switch 7 that functions as a channel select means, the common signal line 11 and a current source 8. The amplifying means 15, 16 and 17 are formed by a MOS source follower, a voltage follower amplifier and the like. Amplification enable terminals 12, 13 and 14 that select an operation state may be disposed in the amplifying means 15, 16 and 17. Also, a parasitic capacitor 9 exists between the gate and the source of the MOS transistor 6.

Figure 7:
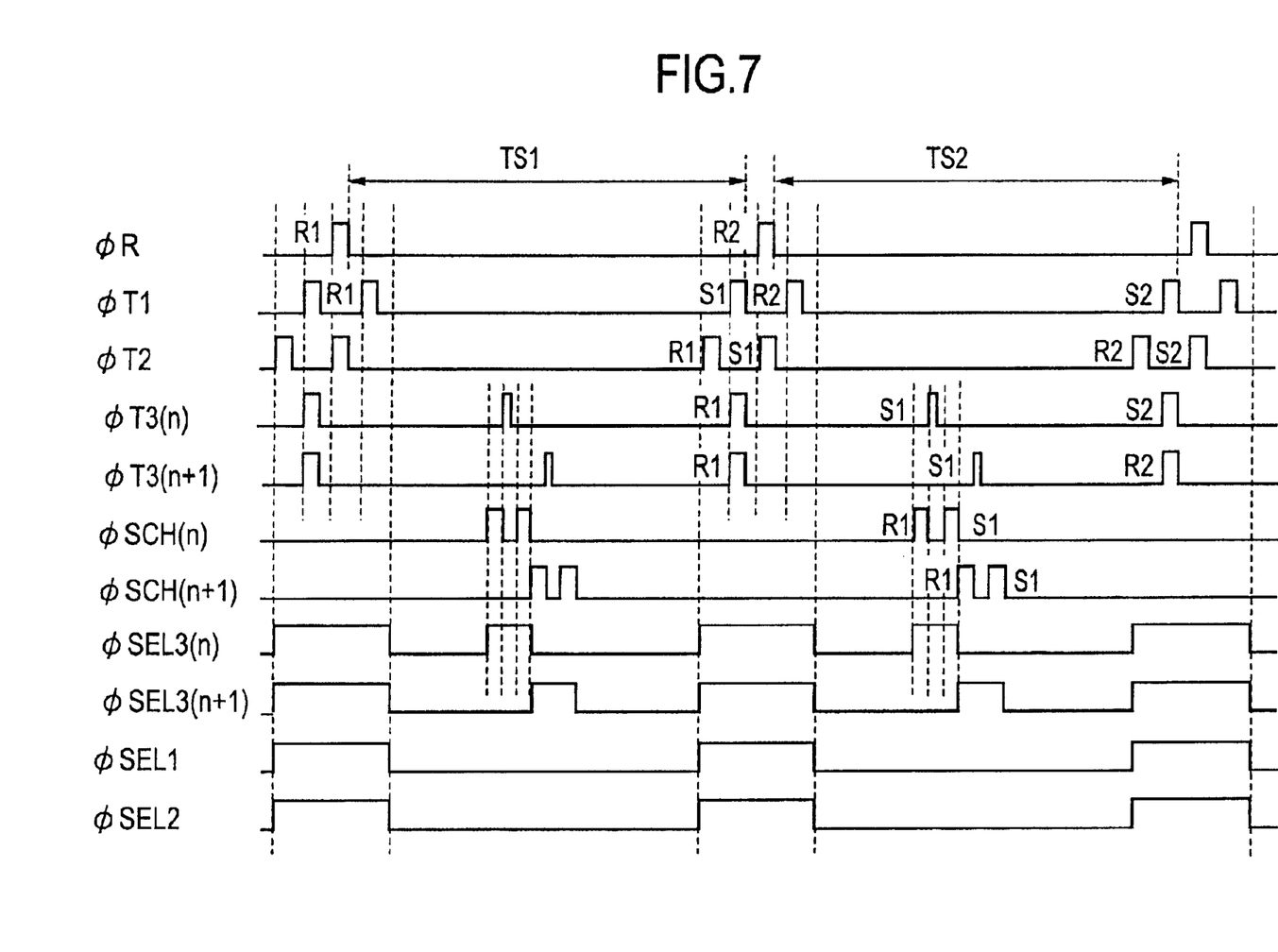
FIG. 7 is a timing chart of the photoelectric converter in accordance with the third embodiment of the present invention.

FIG. 7 is a timing chart of the photoelectric converter in accordance with the third embodiment of the present invention.

Hereinafter, the operation and structure of the photoelectric converter in accordance with this embodiment will be described referring to the timing chart of FIG. 7.

ØR, ØT1, ØT2, ØSEL1 and ØSEL2 in FIG. 6 and FIG. 7 simultaneously operate for every bit. ØSCH and ØT3 differ in timing per operation depending on the bits and, thus, represented by adding "(n)".

Explanation will now be made of an operation of a photoelectric conversion block of n-th bit.

First, a voltage transfer operation will be described.

When the reset switch 2 is turned on due to a pulse at R1 of ØR, an output terminal Vdi of the photodiode 1 is fixed to a reference voltage Vreset. When the reset switch 2 is turned off, a voltage of Vdi becomes a value resulting from adding an off-noise to Vreset. The off-noise becomes a random noise since the potential fluctuates whenever resetting is made. Therefore, in order to prevent the random noise, a difference between the output voltage of the first amplifier 15 after resetting and the output voltage of the first amplifier 15 after the photodiode stores photocharges therein subsequent to the resetting may be taken.

To satisfy the above condition, as shown in FIG. 7, after the reset switch 2 is turned off, the first transfer switch 12 is turned on due to the pulse at R1 of ØT1, the reference charge is read in the first capacitor 21, and the reference charge is saved in the first capacitor 21 for one reading period. During this period, the photocharges are stored in the photodiode 1, and the potential of Vdi varies in accordance with the amount of photocharges. This storing period becomes a period of TS1 shown in FIG. 7.

Subsequently, the second transfer switch 19 is turned on due to a pulse at R1 of ØT2, and the reference charge is read in the second capacitor 22.

Subsequently, the first transfer switch 18 is turned on due to a pulse at S1 of ØT1, and a signal charge corresponding to the charges stored in the photodiode is read in the first capacitor 21. Further, ØT3(n) in every bit is turned on and the reference charge is read in the second capacitor 22.

Subsequently, the photodiode 1 is again reset due to a pulse at R2 of ØR. When the reset switch 2 is turned off, the voltage of Vdi becomes a value resulting from adding an off-noise to Vreset. Further, the second transfer switch 19 is turned on due to a pulse at S1 of ØT2, and a signal charge corresponding to a storing period of TS1 is read in the second capacitor 22.

Subsequently, the first transfer switch 18 is turned on due to a pulse at R2 of ØT1, and the reference charge is read in the first capacitor 21.

Next, explanation will be made of a voltage reading operation.

When the channel select switch 7 is closed due to a pulse at R1 of ØSCH(n) during a storing period of TS2 shown in FIG. 7, a reference charge stored in the third capacitor 23 is read in the common signal line 11. This reference charge is a reference voltage generated by the pulse at R1 of ØR. Next, signal charges corresponding to the charges stored in the photodiode in the period of TS1 are read in the capacitor 23 due to a pulse at S1 of ØT3(n). In this situation, ØSCH(n) is turned off and then ØT3(n) is turned off for a reason that will be described below.

Subsequently, when ØSCH(n) is again turned on, a signal voltage is read in the common signal line 11. The fixed pattern noise and the random noise caused by the reset switch 2 can be removed with a difference between the reference voltage previously read in the common signal line 11 and this signal voltage. This is because the same off-noises of a reset pulse ØR are applied on both of the voltages, which employ the same output paths.

In the above reading manner, it is necessary to satisfy the following conditions. Since the parasitic capacitor 9 shown in FIG. 6 exists, the potential of the source of the MOS transistor 6 when the reference charges are transferred to the capacitor 23 must be identical with that when the signal charges are transferred to the capacitor 23. Since the reference charges and the signal charges are stored in the third capacitor 23 and the parasitic capacitor 9, if the potentials of the source of the MOS transistor 6 are different from each other, even if the potentials of V3 are identical, the amount of charges stored differs. This difference causes a voltage difference when the reference voltage and the signal voltage are read in the common signal line. The potential of the source of the MOS transistor 6 largely changes between the on-state and the off-state of the channel select switch 7. Therefore, in the example of FIG. 7, the channel select switch 7 is in the off-state in the periods of the pulses at R1 and S1 of T3(n). In particular, when ØT3(n) is turned off where the transfer of the charges is completed, it is necessary to cause the ØSCH(n) to be in the off-state.

Figure 8:
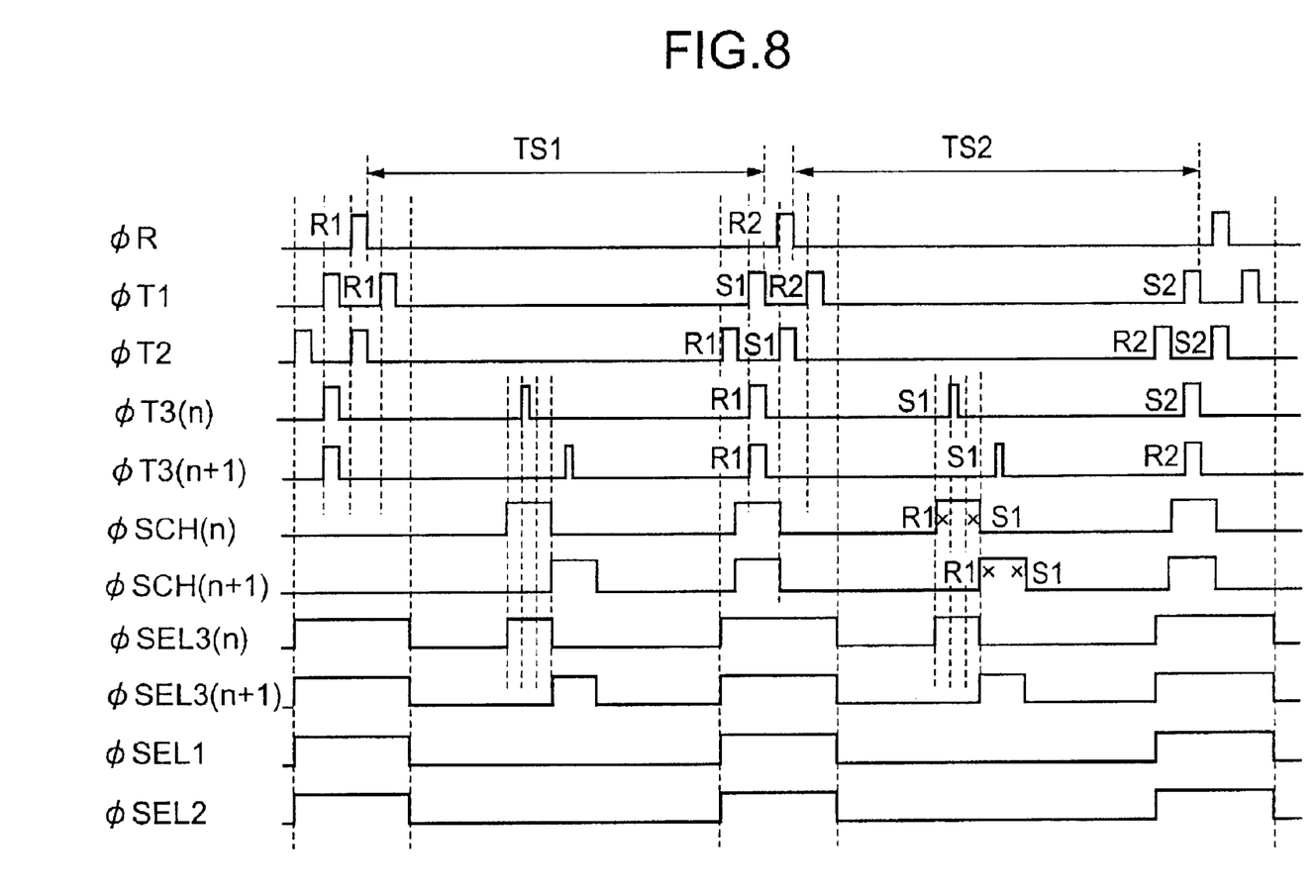
FIG. 8 is a timing chart of a photoelectric converter in accordance with a fourth embodiment of the present invention.

Contrary to FIG. 7, FIG. 8 shows a state where the channel select switch 7 is in the on-state in the periods of the pulses at R1 and S1 of T3(n). In this method, it is necessary to keep the on-state of ØSCH(n) until ØT3(n) is turned off.

In both FIG. 7 and FIG. 8, during the voltage reading operation, ØSCH(n) is turned off and, then, the channel select switch 7 of the subsequent bit is closed due to ØSCH(n+1), whereby reading of a reference voltage of the subsequent bit is started.

A difference between the reference voltage and the signal voltage is taken by using the correlated double sampling circuit. This can be achieved by, for example, the circuit of the block C shown in FIG. 4 as the conventional example.

In the embodiments shown in FIG. 6, FIG. 7 and FIG. 8, the photodiode can read the signal voltage stored in the period of the previous storing period TS1 during a storing operation in the period of TS2. Therefore, it is possible to read color image data by successively turning on LEDs of three colors of RGB. For example, a red component can be read by turning on the LED of red in the period of TS1, a green component can be read by turning on the LED of green in the period of TS2, and a blue component can be read by turning on the LED of blue in the subsequent period of TS2. In this case, a signal voltage of red is read in the period of TS2.

The embodiments of the present invention have been described in the above. However, the present invention is not limited to the above-mentioned respective embodiments, but can be implemented while being variously modified within the subject matter of the present invention.

The above circuit can be formed on one semiconductor substrate as a linear image sensor. Also, a plurality of linear image sensors IC are mounted linearly so as to provide a close contact type image sensor.

As has been described above, according to the present invention, since the signal voltage and the reference voltage containing the same off-noise of the resent switch are read, there can be obtained a photoelectric converter that is small in the fixed pattern noise and the random noise.

Therefore, there can be provided an image sensor IC small in the variation of a dark output with a simple structure. Also, there can be provided a close contact type image sensor in which a plurality of image sensors IC are mounted linearly.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A photoelectric device comprising: a photoelectric transducer for converting light into an electrical signal; reset means for resetting the photoelectric transducer and having an input terminal connected to an output terminal of the photoelectric transducer; an amplifier having an input terminal connected to the output terminal of the photoelectric transducer; a charge transfer switch having a first terminal connected to an output terminal of the amplifier and a second terminal; a capacitor connected to the second terminal of the charge transfer switch; a source follower amplifier having a gate connected to the second terminal of the charge transfer switch; channel select means for selecting a given channel and having a first terminal connected to a source of the source follower amplifier and a second terminal; a common signal line connected to the second terminal of the channel select means, and to a second terminal of a channel select means of each of a plurality of other photoelectric devices; and a current source connected to the common signal line.

2. A photoelectric device comprising: a photoelectric transducer for converting light into an electrical signal; reset means for resetting the photoelectric transducer and having an input terminal connected to an output terminal of the photoelectric transducer; an amplifier having an input terminal connected to the output terminal of the photoelectric transducer; a charge transfer switch having a first terminal connected to an output terminal of the amplifier and a second terminal; a capacitor connected to the second terminal of the charge transfer switch; a source follower amplifier having a gate connected to the second terminal of the charge transfer switch; channel select means for selecting a given channel and having a first terminal connected to a source of the source follower amplifier and a second terminal; a common signal line connected to the second terminal of the channel select means, and to a second terminal of channel select means of each of a plurality of other photoelectric devices; a current source connected to the common signal line; and control means for turning on the channel select means to read a reference voltage on the common signal line, turning on the charge transfer switch to read a signal charge in the capacitor, turning off the charge transfer switch after turning off the channel select means, turning on the channel select means to read a signal voltage on the common signal line, turning on the reset means to initialize the photoelectric conversion means, turning on the charge transfer means to read reference charge in the capacitor after turning of f the reset means, and turning off the charge transfer means after turning off the channel select means.

3. A photoelectric device comprising: a photoelectric transducer for converting light into an electrical signal; reset means for resetting the photoelectric transducer and having an input terminal connected to an output terminal of the photoelectric transducer; an amplifier having an input terminal connected to the output terminal of the photoelectric transducer; a charge transfer switch having a first terminal connected to an output terminal of the amplifier and a second terminal; a capacitor connected to the second terminal of the charge transfer switch; a source follower amplifier having a gate connected to the second terminal of the charge transfer switch; channel select means for selecting a given channel and having a first terminal connected to a source of the source follower amplifier; a common signal line connected to a second terminal of the channel select means, and to a second terminal of channel select means of each of a plurality of other photoelectric devices; a current source connected to the common signal line; and means for turning on the channel select means to read a reference voltage on the common signal line, turning on the charge transfer switch to read signal charges in the capacitor, turning on the charge transfer switch to read a signal voltage in the common signal line, turning on the reset means to initialize the photoelectric conversion means, turning on the charge transfer switch to read reference charges in the capacitor after turning of f the reset means, and turning of f the channel select means after turning off the charge transfer switch.

4. A photoelectric device comprising: photoelectric conversion means for converting light into an electrical signal; reset means for resetting the photoelectric conversion means and having an input terminal connected to an output terminal of the photoelectric conversion means; a first amplifier having an input terminal connected to the output terminal of the photoelectric conversion means; a first charge transfer switch having a first terminal connected to an output terminal of the first amplifier and a second terminal; a first capacitor connected to the second terminal of the first charge transfer switch; a second amplifier having an input terminal connected to the second terminal of the first charge transfer switch; a second charge transfer switch having a first terminal connected to an output terminal of the second amplifier and a second terminal; a second capacitor connected to the second terminal of the second charge transfer means; a third amplifier having an input terminal connected to the second terminal of the second charge transfer switch; a third charge transfer switch having a first terminal connected to an output terminal of the third amplifier and a second terminal; a third capacitor connected to the second terminal of the third charge transfer switch; a source follower amplifier having a gate connected to the second terminal of the third charge transfer switch; channel select means for selecting a given channel and having a first terminal connected to a source of the source follower amplifier; a common signal line connected to a second terminal of the channel select means; and a current source connected to the common signal line.

5. A photoelectric device according to claim 4; further comprising means for turning on the channel select means to read a reference voltage on the common signal line, turning on the third charge transfer switch to read a signal charge in the third capacitor, turning off the third charge transfer switch after turning off the channel select means, and subsequently turning on the channel select means to read a signal voltage on the common signal line.

6. A photoelectric device according to claim 4; further comprising means for turning on the channel select means to read a reference voltage on the common signal line, turning on the third charge transfer switch to read a signal charge in the third capacitor, and then turning off the third charge transfer switch to read a signal voltage on the common signal line.

7. A photoelectric device according to claim 4; further comprising means for performing a repeated series of operations in the order of (1)–(6), comprised of (1) operating the second charge transfer switch, (2) operating the first charge transfer switch and the third charge transfer switch, (3) operating the reset means and the second charge transfer switch, (4) operating the first charge transfer switch, and (5) operating the channel select means.

8. A photoelectric device according to claim 7; wherein the channel select means is never placed in an operating state when the third charge transfer switch ends its operation.

9. A photoelectric device according to claim 7; wherein the channel select means is always in an operation state whenever the third charge transfer switch ends its operation.

* * * * *